US010937839B2

(12) United States Patent
Chung et al.

(10) Patent No.: US 10,937,839 B2
(45) Date of Patent: Mar. 2, 2021

(54) DISPLAY APPARATUS HAVING LEVEL COMPENSATION LAYERS AND METHOD OF MANUFACTURING THE SAME

(71) Applicant: SAMSUNG DISPLAY CO., LTD., Yongin-si (KR)

(72) Inventors: Yunmo Chung, Yongin-si (KR); Takyoung Lee, Yongin-si (KR); Ilhun Seo, Yongin-si (KR); Hojin Yoon, Yongin-si (KR); Daewoo Lee, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 48 days.

(21) Appl. No.: 16/251,262

(22) Filed: Jan. 18, 2019

(65) Prior Publication Data

US 2019/0221616 A1    Jul. 18, 2019

(30) Foreign Application Priority Data

Jan. 18, 2018  (KR) .......................... 10-2018-0006656

(51) Int. Cl.
*H01L 29/08*  (2006.01)
*H01L 27/32*  (2006.01)
(Continued)

(52) U.S. Cl.
CPC ...... *H01L 27/3223* (2013.01); *H01L 27/3258* (2013.01); *H01L 27/3262* (2013.01);
(Continued)

(58) Field of Classification Search
CPC . H01L 27/3223; H01L 51/52; H01L 27/3258; H01L 27/3262; H01L 27/3276;
(Continued)

(56) References Cited

U.S. PATENT DOCUMENTS 6,862,069 B2      3/2005  Kwak et al.
2007/0008446 A1*  1/2007  Moon ................... G02F 1/1345
                                                      349/43
(Continued)

FOREIGN PATENT DOCUMENTS

KR    10-1999-0007017 A    1/1999
KR    10-2001-0066420 A    7/2001
(Continued)

*Primary Examiner* — Caleb E Henry
(74) *Attorney, Agent, or Firm* — Kile Park Reed & Houtteman PLLC (57) ABSTRACT

A display apparatus and a method of manufacturing a display apparatus, the display apparatus including a first area, the first area including a structure of thin layers on a substrate; a second area, the second area including a structure of thin layers on the substrate; a planarization layer that planarizes the first area and the second area; and a step-height compensation layer, wherein the structure of thin layers of the first area is different from the structure of thin layers of the second area, the step-height compensation layer compensates for a height difference between the first area and the second area due to the different structures of thin layers, and the step-height compensation layer is between the substrate and the planarization layer and in the first area or the second area.

10 Claims, 8 Drawing Sheets

(51) Int. Cl.
*H01L 51/52* (2006.01)
*H01L 51/56* (2006.01)
*H01L 51/50* (2006.01)

(52) U.S. Cl.
CPC ...... *H01L 27/3276* (2013.01); *H01L 51/5012* (2013.01); *H01L 51/52* (2013.01); *H01L 51/5206* (2013.01); *H01L 51/5221* (2013.01); *H01L 51/56* (2013.01); *H01L 2227/323* (2013.01); *H01L 2251/558* (2013.01)

(58) Field of Classification Search
CPC . H01L 51/5206; H01L 51/5221; H01L 51/56; H01L 51/5012; H01L 2251/558; H01L 2227/323
See application file for complete search history.

(56) References Cited

U.S. PATENT DOCUMENTS

| | | |
|---|---|---|
| 2008/0318354 A1 | 12/2008 | Lee et al. |
| 2011/0090445 A1* | 4/2011 | Kim ............... G02F 1/1339 349/139 |
| 2011/0115765 A1* | 5/2011 | Chang ............. G02F 1/1345 345/206 |
| 2015/0179099 A1* | 6/2015 | Go ................. H01L 51/525 345/206 |
| 2016/0161793 A1* | 6/2016 | Lee ............... G02F 1/133377 349/96 |
| 2016/0165677 A1* | 6/2016 | Lee ................. H05B 33/10 313/504 |
| 2016/0178945 A1* | 6/2016 | Ryu ............. G02F 1/133514 349/42 |
| 2017/0092664 A1 | 3/2017 | Lee |

FOREIGN PATENT DOCUMENTS

| | | |
|---|---|---|
| KR | 10-0772251 B1 | 10/2007 |
| KR | 10-2009-0123203 A | 12/2009 |
| KR | 10-2017-0037074 A | 4/2017 |

* cited by examiner

DISPLAY APPARATUS HAVING LEVEL COMPENSATION LAYERS AND METHOD OF MANUFACTURING THE SAME

CROSS-REFERENCE TO RELATED APPLICATION

Korean Patent Application No. 10-2018-0006656, filed on Jan. 18, 2018, in the Korean Intellectual Property Office, and entitled: "Display Apparatus and Method of Manufacturing the Same," is incorporated by reference herein in its entirety.

BACKGROUND

1. Field

Embodiments relate to a display apparatus and a method of manufacturing the display apparatus,

2. Description of the Related Art

A display apparatus, such as an organic light-emitting display apparatus, may include, e.g., a display area configured to realize an image, and a non-display area in which various wires connected to the display area are arranged.

SUMMARY

Embodiments are directed to a display apparatus and a method of manufacturing the display apparatus.

The embodiments may be realized by providing a display apparatus including a first area, the first area including a structure of thin layers on a substrate; a second area, the second area including a structure of thin layers on the substrate; a planarization layer that planarizes the first area and the second area; and a step-height compensation layer, wherein the structure of thin layers of the first area is different from the structure of thin layers of the second area, the step-height compensation layer compensates for a height difference between the first area and the second area due to the different structures of thin layers, and the step-height compensation layer is between the substrate and the planarization layer and in the first area or the second area.

The first area may include a display area for realizing an image, and the second area may include a non-display area in which wires for transmitting signals to the display area are arranged.

The step-height compensation layer may be provided in the non-display area.

The non-display area may include a plurality of insulating layers stacked on the substrate, the wires being arranged between the plurality of insulating layers, and the step-height compensation layer may be arranged between the substrate and the wires.

The step-height compensation layer may include a dummy pattern that is not connected to any electrical element in an area surrounding the step-height compensation layer.

The dummy pattern may include a conductive layer.

The dummy pattern may include an insulating layer.

The display area may include a thin film transistor and an organic light-emitting device connected to the thin film transistor.

The thin film transistor may include an active layer on the substrate, a plurality of gate electrodes facing the active layer, and a source electrode and a drain electrode connected to the active layer.

The organic light-emitting device may include a pixel electrode connected to the source and drain electrodes, an opposite electrode facing the pixel electrode, and an organic emission layer interposed between the pixel electrode and the opposite electrode and operating in response to a voltage between the pixel electrode and the opposite electrode.

The embodiments may be realized by providing a method of manufacturing a display apparatus, the method including forming a first area on a substrate such that the first area includes a structure of thin layers, forming a second area on the substrate such that the second area includes a structure of thin layers that is different from the structure of thin layers of the first area; forming a step-height compensation layer in the first area or the second area such that the step-height compensation layer compensates for a height difference between the first area and the second area due to the different structures; and covering the first area and the second area with a planarization layer such that the step-height compensation layer is between the substrate and the planarization layer; planarizing a surface of the planarization layer by performing a chemical mechanical polishing process.

The first area may include a display area for realizing an image, and the second area may include a non-display area in which wires for transmitting signals to the display area are arranged.

The step-height compensation layer may be formed in the non-display area.

The non-display area may include a plurality of insulating layers stacked on the substrate, the wires being arranged between the plurality of insulating layers, and the step-height compensation layer may be arranged between the substrate and the wires.

The step-height compensation layer may include a dummy pattern that is not connected to any electrical element in an area surrounding the step-height compensation layer.

The dummy pattern may include a conductive layer.

The dummy pattern may include an insulating layer.

A thin film transistor and an organic light-emitting device connected to the thin film transistor may be formed in the display area.

The thin film transistor may include an active layer on the substrate, a plurality of gate electrodes facing the active layer, and a source electrode and a drain electrode connected to the active layer.

The organic light-emitting device may include a pixel electrode connected to the source and drain electrodes, an opposite electrode facing the pixel electrode, and an organic emission layer interposed between the pixel electrode and the opposite electrode and operating in response to a voltage between the pixel electrode and the opposite electrode.

BRIEF DESCRIPTION OF THE DRAWINGS

Features will be apparent to those of skill in the art by describing in detail exemplary embodiments with reference to the attached drawings in which.

DETAILED DESCRIPTION

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

In the drawing figures, the dimensions of layers and regions may be exaggerated for clarity of illustration. It will also be understood that when a layer or element is referred to as being "on" another layer or element, it can be directly on the other layer or element, or intervening layers may also be present. In addition, it will also be understood that when a layer is referred to as being "between" two layers, it can be the only layer between the two layers, or one or more intervening layers may also be present. Like reference numerals refer to like elements throughout.

As used herein, the singular forms "a," "an," and "the" are intended to include the plural forms as well, unless the context clearly indicates otherwise.

It will be further understood that the terms "includes," "including," "comprises" and/or "comprising" used herein specify the presence of stated features or components, but do not preclude the presence or addition of one or more other features or components.

When a certain embodiment may be implemented differently, a specific process order may be performed differently from the described order. For example, two consecutively described processes may be performed substantially at the same time or performed in an order opposite to the described order.

Figure 1:
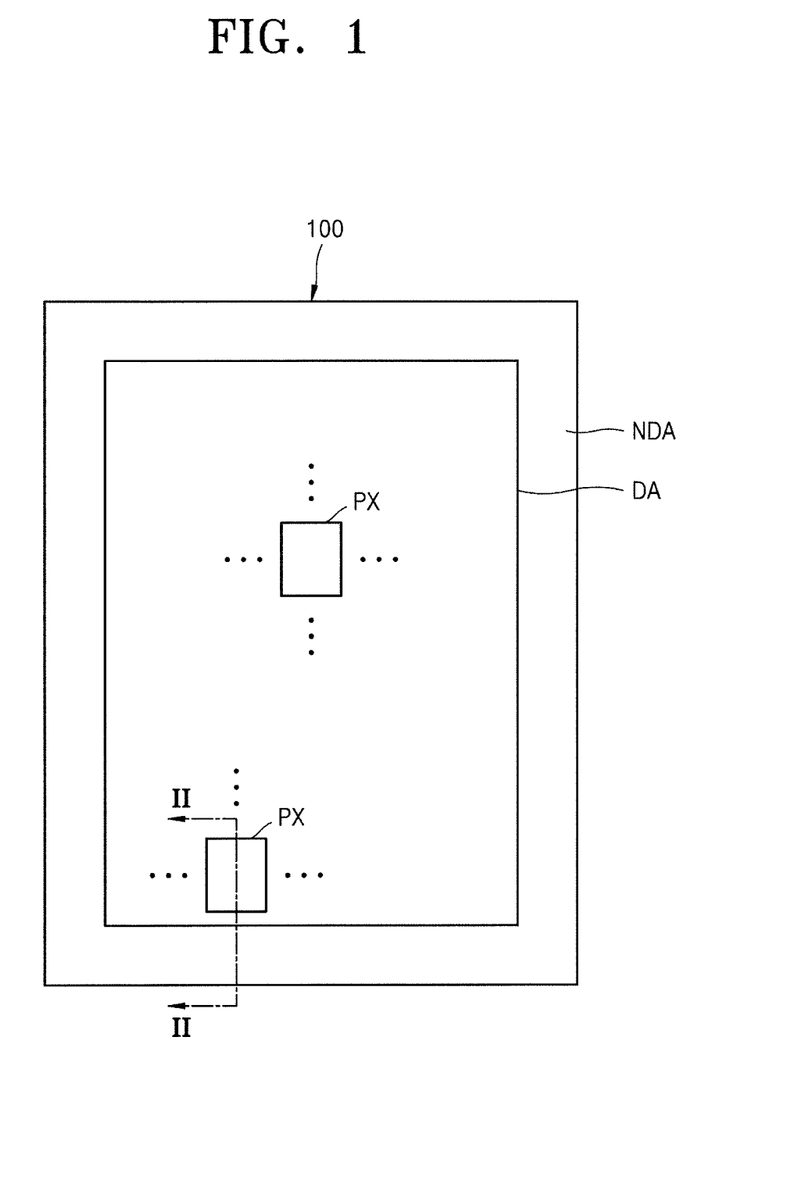
FIG. 1 illustrates a plan view of a display apparatus according to an embodiment.

FIG. 1 illustrates a schematic plan view of an organic light-emitting display apparatus, which is an example of a display apparatus according to an embodiment.

As illustrated in FIG. 1, the organic light-emitting display apparatus may include a display area DA for displaying an image and a non-display area NDA adjacent to the display area DA. A plurality of pixels PX may be provided in the display area DA and an image may be realized via light emitted from each of the plurality of pixels PX.

The non-display area NDA may be arranged to surround the display area DA, and wires for transmitting certain signals to the plurality of pixels PX in the display area DA may be arranged in the non-display area NDA.

In an implementation, as illustrated in FIG. 1, that the non-display area NDA may surround the display area DA. In an implementation, the non-display area NDA may be arranged at a side of the display area DA so as to reduce an area in which an image is not displayed, e.g., a dead area.

Figure 2:
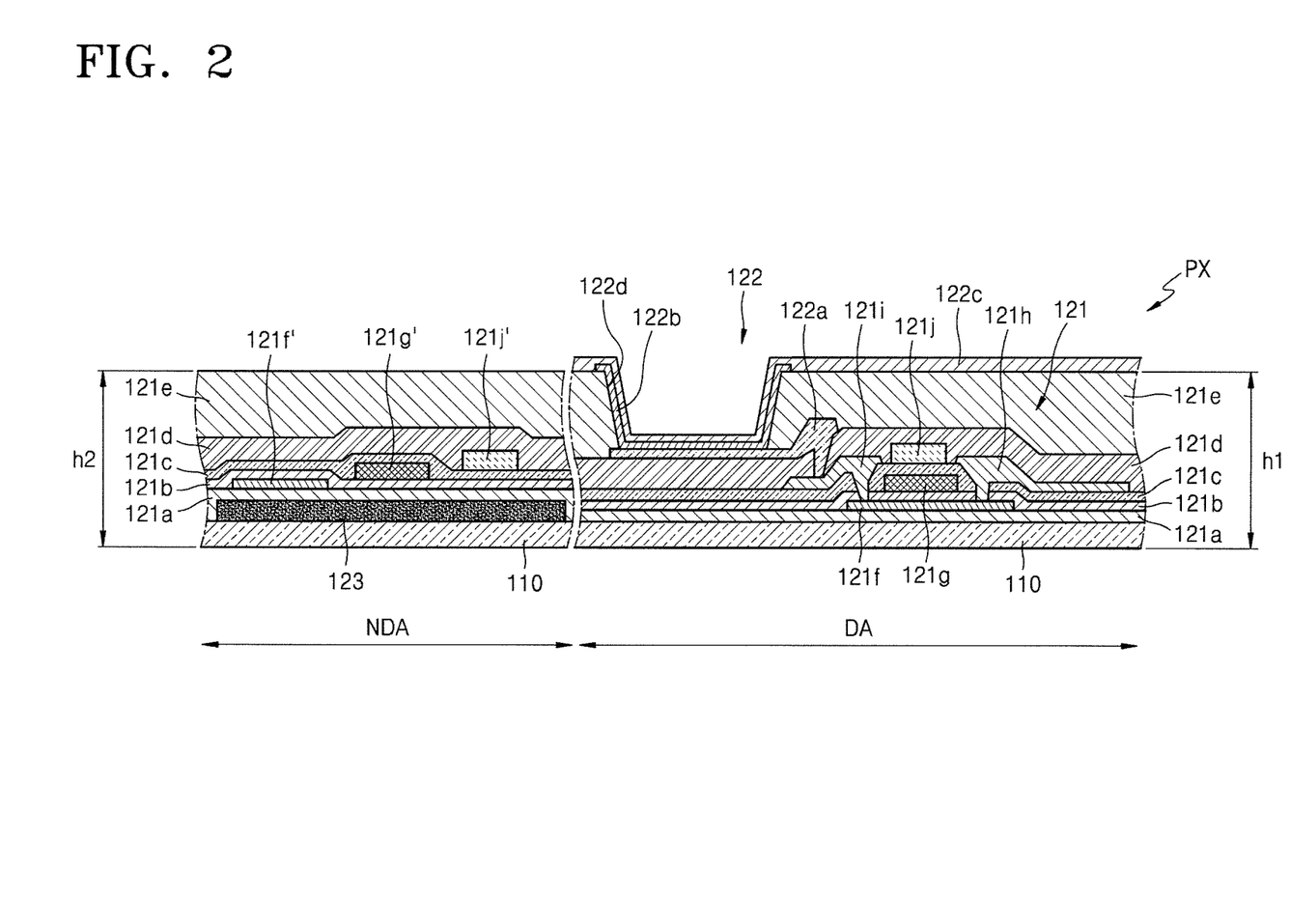
FIG. 2 illustrates a cross-sectional view taken along line II-II of FIG. 1.

FIG. 2 illustrates a cross-sectional view taken along a line II-II of FIG. 1. A thin film transistor 121 and an organic light-emitting device 122 may be provided in one pixel PX of the display area DA, and various wires 121f', 121g', and 121j' electrically connected to the display area DA may be arranged in the non-display area NDA. For example, when it is assumed that the display area DA is a first area and the non-display area NDA is a second area, the first area and the second area may have different structures of thin layers from each other, as illustrated in FIG. 2. Accordingly, the structures of the first and second areas may have different heights.

In order to help compensate the height difference, a step-height compensation layer 123 may be provided. Descriptions with respect to the step-height compensation layer 123 will be given below.

First, with respect to a structure of the thin film transistor 121 of the display area DA, an active layer 121f may be formed above or on a buffer layer 121 that is adjacent to a substrate 110, wherein the active layer 121f may have a source area and a drain area doped with n-type or p-type impurities in a high concentration. The active layer 121f may include an oxide semiconductor. For example, the oxide semiconductor may include an oxide of a material selected from groups 12, 13, and 14 metal elements, such as Zn, In, Ga, Sn, Cd, Ge, or Hf, and a combination of the groups 12, 13, and 14 metal elements. For example, the active layer 121f may include G-I—Z—O [$(In_2O_3)a(Ga_2O_3)b(ZnO)c$] (in which each of a, b, and c is a real number satisfying the condition of a≥0, b≥0, and c>0). A first gate electrode 121g and a second gate electrode 121j may be formed above the active layer 121f with a gate insulating layer 121b and an interlayer insulating layer 121c interposed between the active layer 121f, and the first and second gate electrodes 121g and 121j. A source electrode 121h and a drain electrode 121i may be formed above the gate electrode 121g. The interlayer insulating layer 121c may be provided between the gate electrode 121g, and the source electrode 121h and the drain electrode 121i. Also, a passivation layer 121d may be interposed between the source electrode 121h and the drain electrode 121i, and an anode 122a of the organic light-emitting device 122.

A planarization layer 121e (having an insulating property) may be formed above the anode 122a by using acryl, etc. The organic light-emitting device 122 may be formed after forming a certain opening 122d in the planarization layer 121e.

The organic light-emitting device 122 may display certain image information by emitting lights of red, green, and blue according to a flow of current. The organic light-emitting device 122 may include the anode 122a connected to the drain electrode 121i and receiving plus power from the drain electrode 121i, a cathode 122c provided to cover the entire pixels PX and supplying minus power to the entire pixels PX, and an organic emission layer 122b arranged between the anode 122a and the cathode 122c and emitting light.

A hole injection layer (HIL), a hole transport layer (HTL), an electron transport layer (ETL), an electron injection layer (EIL), etc., may be stacked to be adjacent to the organic emission layer 122b.

For example, the organic emission layer 122b may be formed for each pixel, so that the pixels emitting lights of red, green, and blue are gathered to form a unit pixel. In an implementation, the organic emission layer 122b may be commonly formed throughout the entire pixel area, irrespective of locations of the pixels PX. For example, layers including emission materials for emitting lights of red, green, and blue may be vertically stacked or combined to form the organic emission layer. In an implementation, other combinations of colors are possible, when the combinations may emit light of white. Also, a color conversion layer for converting the light of white that is emitted into a certain color, or a color filter may further be provided.

In addition, a thin film encapsulation layer in which organic layers and inorganic layers are alternately stacked may further be formed above the cathode 122c.

Meanwhile, in the non-display area NDA, a step-height compensation layer 123 (for reducing or compensating for a height difference between the non-display area NDA and the display area DA before the planarization layer 121e is arranged to cover the non-display area NDA and the display area DA) may be provided between the substrate 110 and the buffer layer 121a. The step-height compensation layer 123 may literally compensate for the height difference between the non-display area NDA and the display area DA so that the planarization layer 121e may have an increased degree of planarization. For example, the display area DA may include a relatively greater number of thin layers than the non-display area NDA, wherein the thin layers stacked in the display area DA may include, e.g., the thin film transistor 121 and the organic light-emitting device 122, and a height h2 of the non-display area NDA may be less than a height h1 of the display area DA. If the planarization layer 121e were to be arranged to cover the non-display area NDA and the display area DA in this state, a significant step-height could be generated due to the height difference between the non-display area NDA and the display area DA. Thus, planarization may not be smoothly achieved even when a chemical mechanical polishing process is subsequently performed later. In an effort to remove or reduce the step-height, the step-height compensation layer 123 may be arranged to make the height h1 of the display area DA and the height h2 of the non-display area NDA similar as each other. Then, the planarization layer 121e may be arranged to perform the chemical mechanical polishing process. This manufacturing process will be described below.

The step-height compensation layer 123 may be an isolated dummy pattern that is not connected to other wires or electrical elements that are around or adjacent to the step-height compensation layer 123. In an implementation, the step-height compensation layer 123 may include a conductive layer, as the active layer 121f, the first and second gate electrodes 121g and 121j, and the source and drain electrodes 121h and 121i, or may include an insulating layer, such as the gate insulating layer 121b and the interlayer insulating layer 121c.

The display apparatus having this structure may be manufactured as illustrated in FIGS. 3A through 3D.

Figure 3A:
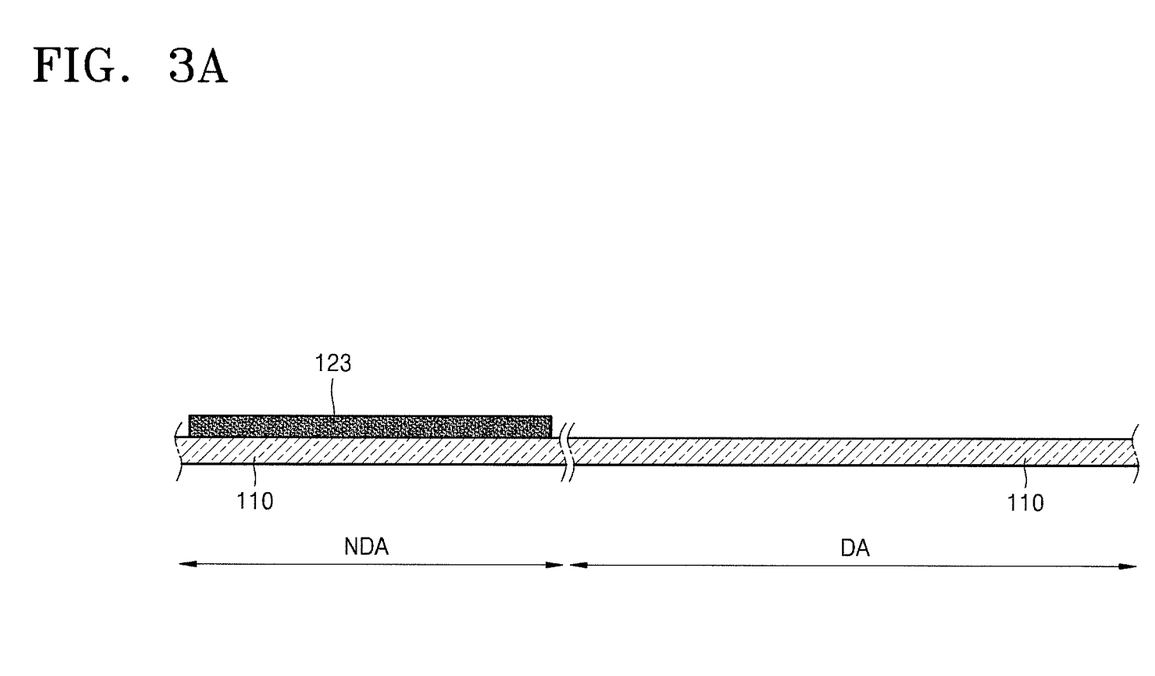
FIGS. 3A through 3D illustrate cross-sectional views of stages in a method of manufacturing a display apparatus, according to an embodiment.

Referring to FIG. 3A, first, the step-height compensation layer 123 may be formed on the substrate 110 in the non-display area NDA. As described above, the step-height compensation layer 123 may be the dummy pattern and may include, e.g., the insulating layer or the conductive layer. The step-height compensation layer 123 may be formed to have a thickness that approximately compensates for the anticipated or calculated height difference between the non-display area NDA and the display area DA before the planarization layer 121e is arranged in the non-display area NDA and the display area DA.

Figure 3B:
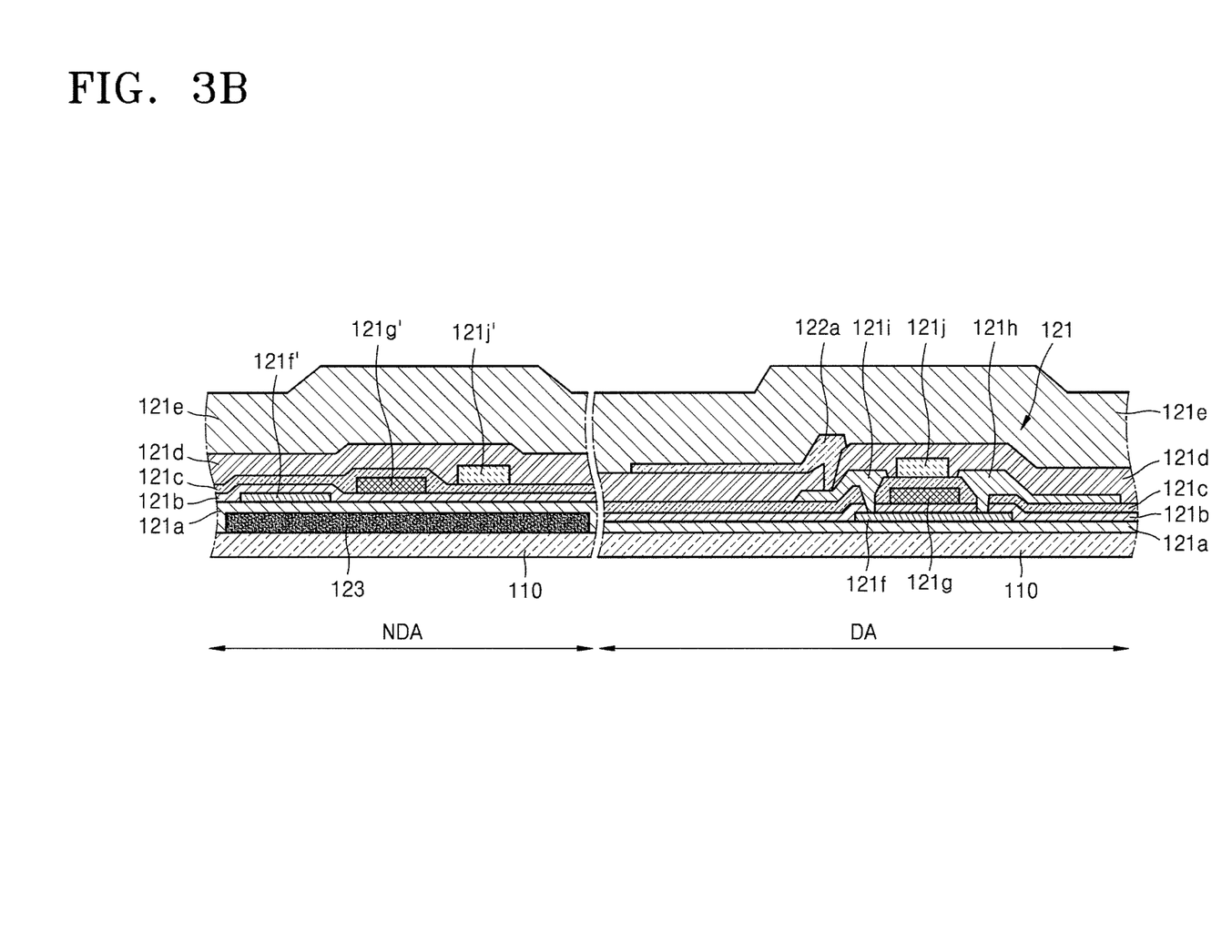

Thereafter, the thin layers of the display area DA and the non-display area NDA may be sequentially stacked as illustrated in FIG. 3B, and the planarization layer 121e may be arranged to cover the display area DA and the non-display area NDA (having almost no height difference from each other, due to the step-height compensation layer 123).

Figure 3C:
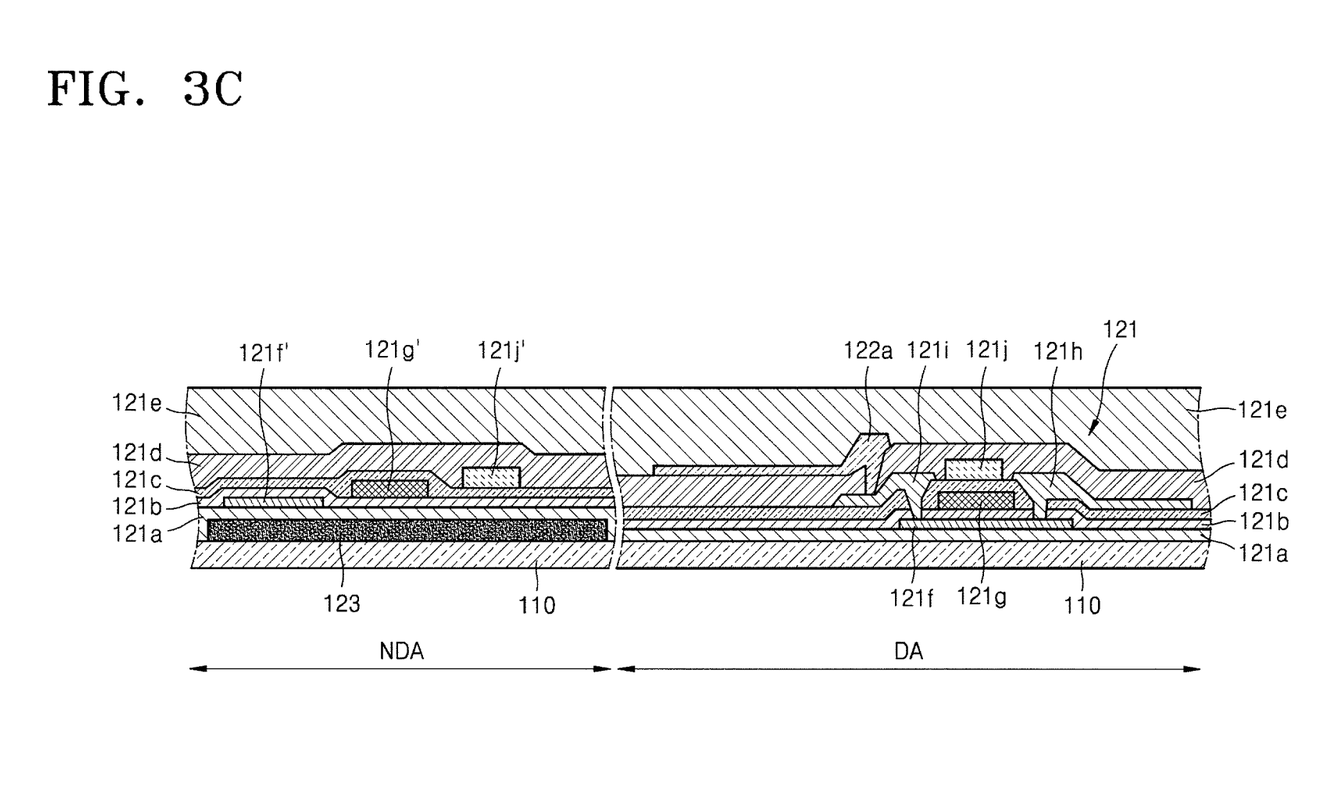
Figure 4:
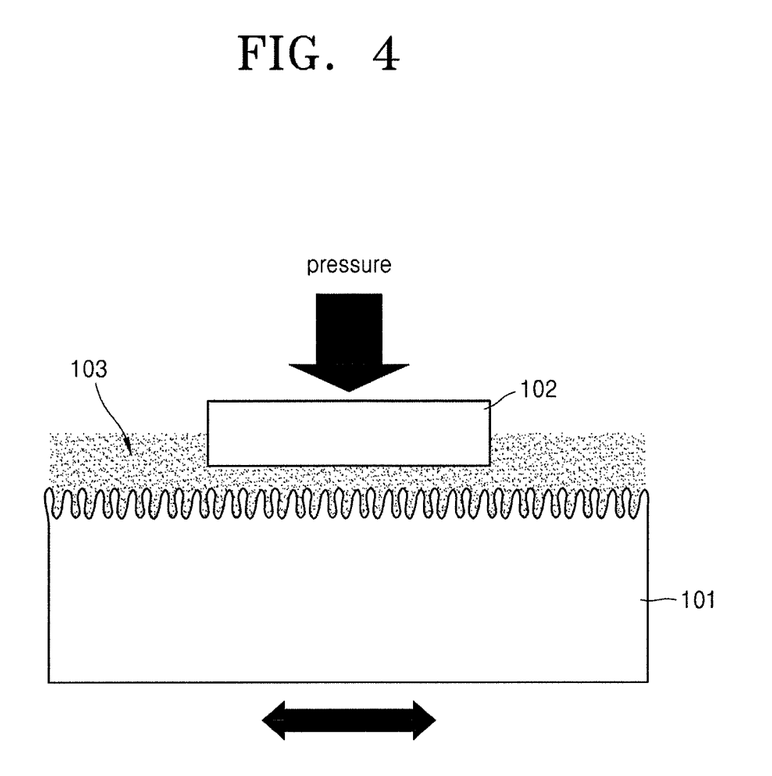
FIG. 4 illustrates a view for describing a chemical mechanical polishing operation.

In this state, a chemical mechanical polishing process may be performed to flatly polish an upper surface of the planarization layer 121e, as illustrated in FIG. 3C. Here, the chemical mechanical polishing process may be performed based on a principle schematically illustrated in FIG. 4. Based on this principle, an object to be polished 102 may be pressed toward a polishing pad 101 so that the object to be polished 102 adheres to the polishing pad 101, and a slurry 103, which is a processing fluid, may be provided to permit the polishing pad 101 and the object to be polished 102 to perform relative motion in order to perform the polishing process. By this process, chemical polishing due to the slurry 103 and mechanical polishing due to the polishing pad 101 may be simultaneously performed, and thus, the object to be polished 102 may be smoothly polished.

According to the present embodiment, in FIG. 3B, the object to be polished 102 may correspond to a stack of the thin layers between the substrate 110 and the planarization layer 121e. Portions protruding due to curvedness of the layers below the portions may be polished and planarized via the polishing pad 101. There may be almost no height difference between the display area DA and the non-display area NDA due to the step-height compensation layer 123, and a step-height between the non-display area NDA and the display area DA may be removed after the polishing process. For example, a smoothly planarized surface may be achieved.

Figure 3D:
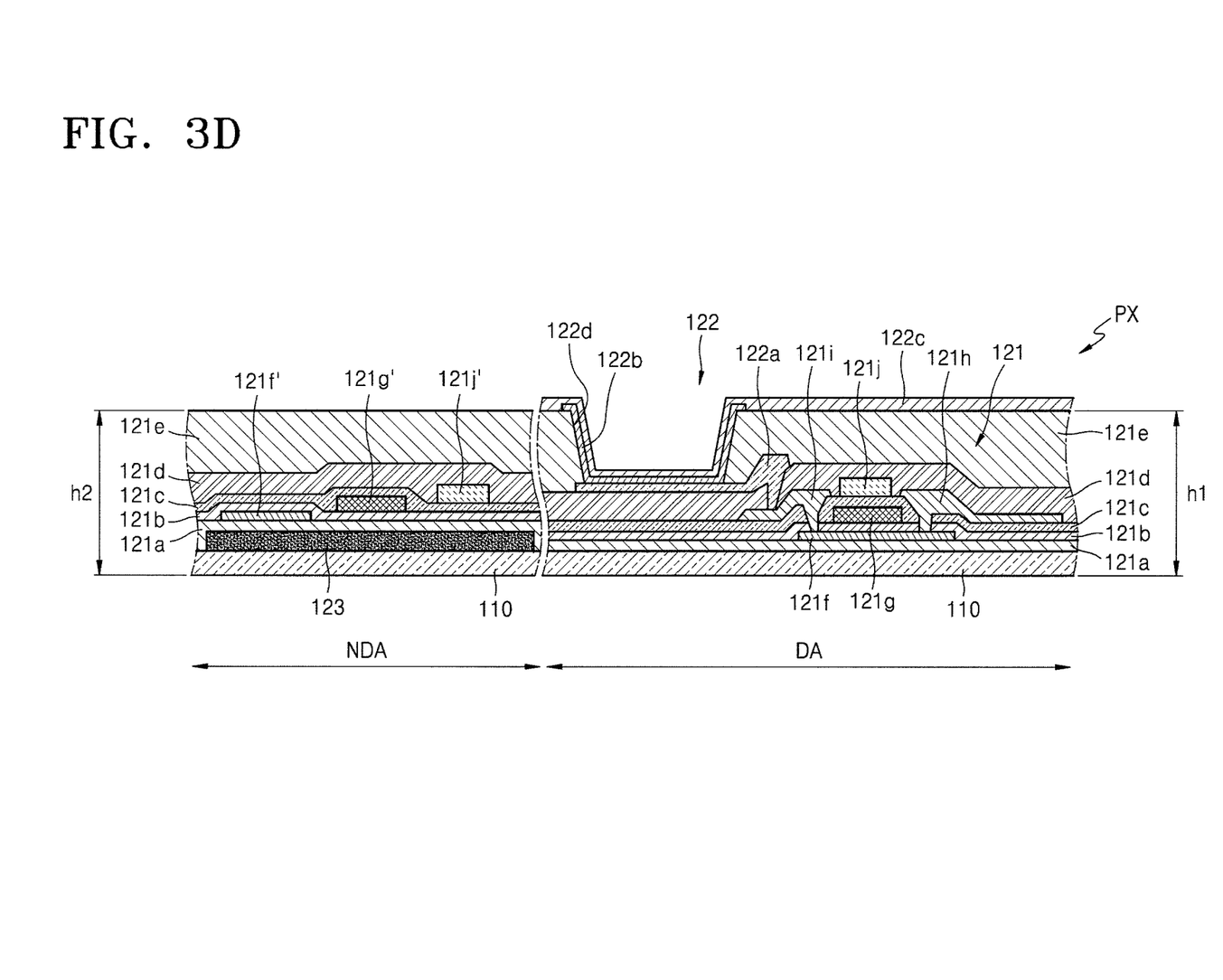

Thereafter, as illustrated in FIG. 3D, the organic light-emitting device 122 may be formed by forming the opening 122d in the planarization layer 121e and forming the organic emission layer 122b and the cathode 122c.

Thus, by using the step-height compensation layer 123, a stable structure, whereby a step-height may be removed or may not be present in the finally formed planarization layer 121e, may be achieved. Also, when a hole, such as the opening 122d, is generated or formed, a difference between the display area DA and the non-display area NDA could be increased due to the step-height. However, based on the step-height compensation layer 123, this difference may be removed. Therefore, a display apparatus having this structure may have a stable product quality.

Figure 5:
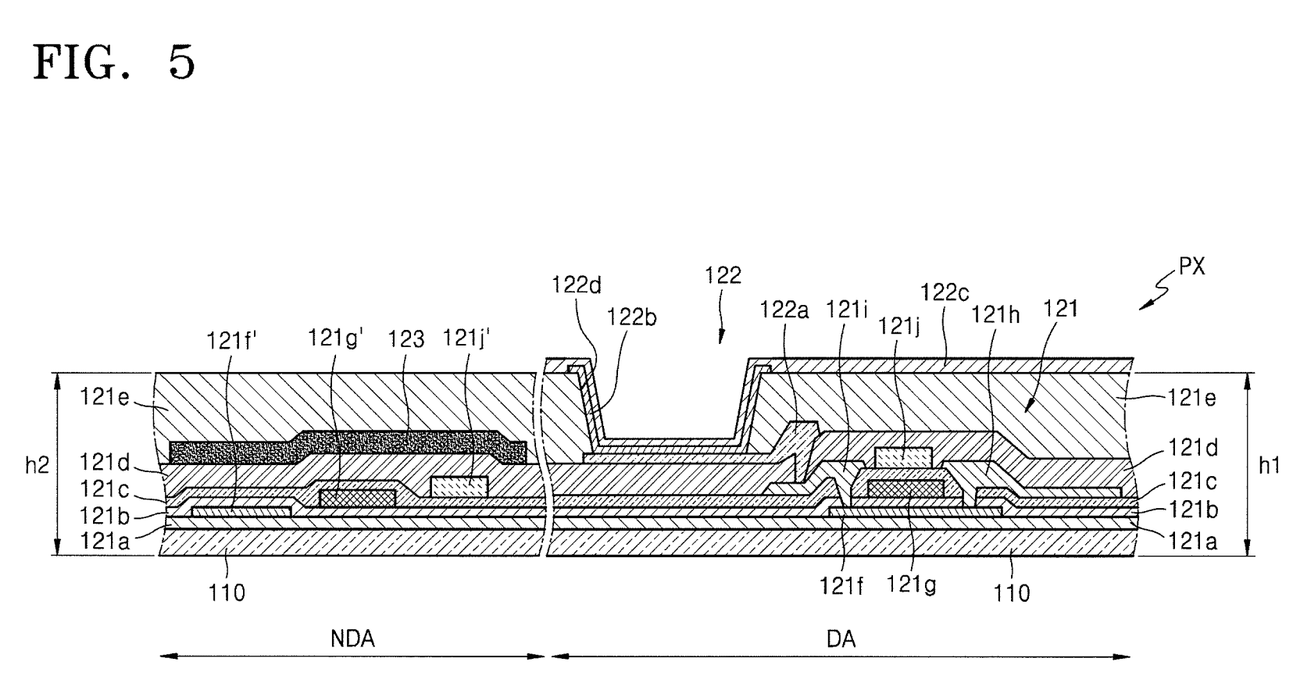
FIG. 5 illustrates a cross-sectional view of an example of a modified arrangement of a step-height compensation layer illustrated in FIG. 2.

According to the embodiment described above, the step-height compensation layer 123 may be arranged between the substrate 110, and the wires 121f', 121g', and 121j'. In an implementation, the step-height compensation layer 123 may be arranged above the wires 121f', 121g', and 121j', as illustrated in FIG. 5. For example, the step-height compensation layer 123 may be arranged at any suitable location between the substrate 110 and the planarization layer 121e, where the step-height compensation layer 123 may reduce a height difference between the display area DA and the non-display area NDA.

By way of summation and review, a display area and a non-display area may have structures in which a plurality of various insulating layers and conductive layers are stacked. The structure of the display area and the structure of the non-display area may be different from each other, and there may be a difference in height between the display area and the non-display area. In order to planarize the difference in height, an insulating layer may be arranged to entirely cover the display area and non-display area and a chemical mechanical polishing process may be performed in order to remove a step-height based on the difference in height.

With the structure of the display area being more complex and having a greater number of stacked layers than the structure of the non-display area, the difference in height between the display area and the non-display area may be increased. The step-height may not be completely removed even by performing the chemical mechanical polishing process. In this case, when making a contact hole in an insulating layer to connect the wires, on the basis of an area which is lower based on the step-height, the contact hole may not be completely generated in an area which is higher based on the step-height. Accordingly, defects with respect to the contact hole could occur.

Thus, in order to secure stable characteristics of a product, a method of addressing the planarization defects due to the step-height may be considered.

The embodiments may provide a display apparatus manufactured by using a planarization process based on chemical mechanical polishing.

The embodiments may provide a display apparatus that is improved to realize a stable planarization surface via chemical mechanical polishing, and a method of manufacturing the display apparatus.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A display apparatus, comprising:
a first area that includes a display area for realizing an image, the first area including a structure of thin layers on a substrate;
a second area that includes a non-display area in which wires for transmitting signals to the display area are arranged, the second area including a structure of thin layers on the substrate such that the structure of thin layers of the first area is different from the structure of thin layers of the second area;
a planarization layer that planarizes the first area and the second area; and
a step-height compensation layer, step-height compensation layer being between the substrate and the planarization layer and in the first area or the second area, wherein:
the step-height compensation layer compensates for a height difference between the first area and the second area due to the different structures of thin layers such that a height difference of the planarization layer between the display area and the non-display area is reduced.

2. The display apparatus as claimed in claim 1, wherein the step-height compensation layer is provided in the non-display area.

3. The display apparatus as claimed in claim 2, wherein:
the non-display area includes a plurality of insulating layers stacked on the substrate, the wires being arranged between the plurality of insulating layers, and
the step-height compensation layer is arranged between the substrate and the wires.

4. The display apparatus as claimed in claim 1, wherein the step-height compensation layer includes a dummy pattern that is not connected to any electrical element in an area surrounding the step-height compensation layer.

5. The display apparatus as claimed in claim 4, wherein the dummy pattern includes a conductive layer.

6. The display apparatus as claimed in claim 4, wherein the dummy pattern includes an insulating layer.

7. The display apparatus as claimed in claim 1, wherein the display area includes a thin film transistor and an organic light-emitting device connected to the thin film transistor.

8. The display apparatus as claimed in claim 7, wherein the thin film transistor includes:
an active layer on the substrate,
a plurality of gate electrodes facing the active layer, and
a source electrode and a drain electrode connected to the active layer.

9. The display apparatus as claimed in claim 8, wherein the organic light-emitting device includes:
a pixel electrode connected to the source and drain electrodes,
an opposite electrode facing the pixel electrode, and
an organic emission layer interposed between the pixel electrode and the opposite electrode and operating in response to a voltage between the pixel electrode and the opposite electrode.

10. The display apparatus as claimed in claim 1, wherein the planarization layer has a polished upper surface in both the display area and the non-display area.

* * * * *